US006841805B2

(12) United States Patent
McCann et al.

(10) Patent No.: US 6,841,805 B2
(45) Date of Patent: Jan. 11, 2005

(54) METHOD FOR GENERATING MID-INFRARED LIGHT

(75) Inventors: Patrick J. McCann, Norman, OK (US); Xiao-Ming Fang, Macungie, PA (US)

(73) Assignee: McCann & Associates, Inc., Norman, OK (US)

( * ) Notice: Subject to any disclaimer, the term of this patent is extended or adjusted under 35 U.S.C. 154(b) by 119 days.

(21) Appl. No.: 10/192,624

(22) Filed: Jul. 10, 2002

(65) Prior Publication Data

US 2002/0177248 A1 Nov. 28, 2002

Related U.S. Application Data

(63) Continuation-in-part of application No. 09/677,508, filed on Oct. 2, 2000, now abandoned.
(60) Provisional application No. 60/158,662, filed on Oct. 8, 1999.

(51) Int. Cl.$^7$ .............................................. H01L 33/00
(52) U.S. Cl. ............................ 257/103; 257/94; 372/44
(58) Field of Search ........................................ 257/103

(56) References Cited

U.S. PATENT DOCUMENTS

| | | | | |
|---|---|---|---|---|
| 4,339,764 A | | 7/1982 | Schoolar ....................... | 357/30 |
| 5,119,388 A | | 6/1992 | Feit et al. ..................... | 372/44 |
| 5,204,870 A | | 4/1993 | Faist et al. .................... | 372/45 |
| 5,729,020 A | | 3/1998 | Matsushita et al. .... | 250/370.08 |
| 5,754,578 A | * | 5/1998 | Jayaraman ................... | 372/50 |
| 5,799,030 A | * | 8/1998 | Brenner ....................... | 372/50 |
| 6,393,038 B1 | * | 5/2002 | Raymond et al. ............. | 372/22 |

FOREIGN PATENT DOCUMENTS

JP        7221397        2/1994

OTHER PUBLICATIONS

Beyer et al., Termoelectric Properties of Epitaxial PbSrTe and PbSrSe Bulk and MQW Thin Films, 18$^{th}$ International Conference on Thermoelectrics Aug. 29–Sep. 1999, pp 687–695.*
Schiessl et al., 60 degree C lead salt laser emission near 5–micron wavelength, Infrared Physica and Technology Augst 1999, pp 325–328.*
Takahashi et al., PbS/PbSrS Multi–Quantum Well Laser Emitting in the Mid–Infrared Wavelength Region Electronics Letters V 26, pp. 1715–1716, 1990.*
Shi, Z. et al., Midinfrared lead salt multi–quantum–well diode lasers with 282 K operation, May 8, 1995 Applied Physics Letters 66, pp. 2537–2539.
Goltsos W. et al., "Photoluminescence in PbTe–PbEuTe Se multiquantum wells", Jun. 15, 1985, Applied Physics Letters 46 pages 1173–1175.
Spanger Beate, et al., Near–room–temperature operation of Pb Sr Se Infrared diode lasers using Dec. 26, 1988 molecular beam epitaxy growth techniques, Applied Physics Letters 53, pp. 2582–2583.
Valeiko, M.V. et al., "Photoluminescence of stressed quantum–well epitaxial films and structures made of Pb Sn Te" 1–x x Jan. 1987, Sov. Phys. Semicond. 21, pp. 34–37.
Kreichbaum et al., PbTe/PbSnTe Multiquantum wells, IEEE JQE, pp. 1727–1743 V24.

(List continued on next page.)

Primary Examiner—Douglas Wille
(74) Attorney, Agent, or Firm—Florence F. McCann

(57) ABSTRACT

A method for generating mid-infrared light by maintaining multiple quantum well (MQW) structures based on the alloy systems PbSrZ and PbSnZ, where Z is S, Se, or Te, at temperatures in the range of from about 5° C. to about 55° C. and pumping the MQW structures with a shorter wavelength laser pump beam or with an electrical current is provided.

8 Claims, 13 Drawing Sheets

OTHER PUBLICATIONS

Beyer et al., Thermoelectric Properites of Epitaxial PbSrTe and PbSrSe Bulk and MQW Thin Films 18th International Conference of Thermoelectrics, Aug. 29–Sep. 2 1999, pp 687–685.

Paglino et al., Schottky–barrier fluctuations in PbSnSe infrared sensors, Applied Physics V 80, Dec. 1996, pp 7138–7143.

* cited by examiner

METHOD FOR GENERATING MID-INFRARED LIGHT

This application is a continuation in part and claims the benefit of U.S. patent application Ser. No. 09/677,508 filed Oct. 2, 2000 now abandoned which application further claims the benefit of U.S. Provisional Application No. 60/158,662 filed Oct. 8, 1999.

The United States Government has rights in this invention based on grants DMR-9802396 and DMR-9416871 from the National Science Foundation.

BACKGROUND OF THE INVENTION

1. Field of the Invention

The invention relates to a method for generating mid-infrared light using multiple quantum well optically active materials.

2. Description of the Prior Art

Many electronic and telecommunications devices such as lasers and light emitting diodes require highly reliable light emitting components. It is especially desirable that such light emitting components be on silicon thereby making them compatible with existing silicon-based electronics. Until now, fabrication of such reliable light emitting devices, particularly on silicon has been limited by the ability of the optically active material to withstand thermal stresses associated with device operation. Since the direct band gap semiconductor materials that typically are the optically active material in such devices characteristically have large thermal expansion mismatches with common substrate materials, and especially with silicon, the heating generated during device operation can produce sufficient tensile or compressive stress to rapidly degrade the performance of the optically active material. Likewise, current methods for generating mid-infrared light require steps of cooling the light-emitting devices to cryogenic temperatures.

Thus, there exists a need for a method for generating mid-infrared light at temperatures near room temperature including providing a robust, optically active material, preferably one that can be grown directly on a silicon substrate.

SUMMARY OF THE INVENTION

The invention provides methods for generating mid-infrared light by either optically or electrically pumping PbSrZ or PbSnZ alloy based multiple quantum well structures.

The invention provides a method for generating mid-infrared light including steps of providing a multiple quantum well structure based on a PbSrZ alloy having of a plurality, n, of quantum wells, where n is in the range of from about 10 to about 70; maintaining the multiple quantum well structure at a temperature in the range of from about 5° C. to about 55° C.; and pumping the multiple quantum well structure with a beam of laser light characterized by a laser light wavelength shorter than the wavelength of mid-infrared light resulting in generation of mid-infrared light. Each of the quantum wells includes a $Pb_{1-y}Sr_yZ$ layer where Z can be S, Se, or Te, y is in the range of from about 0 atomic percent to about 15 atomic percent having a layer thickness in the range of from about 2 nm to about 40 nm intervening between two $Pb_{1-x}Sr_xZ$ layers wherein x>y and x is in the range of from about 0 atomic percent to about 20 atomic percent. Each $Pb_{1-x}Sr_xZ$ layer has a layer thickness in the range of from about 30 nm to 70 nm. The PbSrZ-based alloy layers are grown on a substrate.

Alternatively, in the method for electrically pumping the PbSrZ alloy based multiple quantum well structure to generate mid-infrared light, the multiple quantum well is placed between n-type and p-type electrical contact layers and the step of pumping is accomplished by providing an electrical current.

Another method for generating mid-infrared light includes steps of providing a multiple quantum well structure based on a PbSnZ alloy, which has a narrower bandgap than the previously described PbSrZ alloy maintaining the multiple quantum well structure at a temperature in the range of from about 5° C. to about 55° C.; and pumping the multiple quantum well structure with a beam of laser light characterized by a laser light wavelength shorter than the wavelength of mid-infrared light resulting in the generation of mid-infrared light. The PbSnZ alloy based multiple quantum well structure further includes a plurality n of quantum wells, where n is in the range of from about 10 to about 70. Each of the quantum wells includes a $Pb_{1-y}Sn_yZ$ layer where Z can be S, Se, or Te, y is in the range of from about 0 atomic percent to 40 atomic percent, having a layer thickness in the range of from about 2 nm to about 40 nm intervening between the two $Pb_{1-x}Sn_xZ$ layers wherein x<y and x is in the range of from about 0 atomic percent to about 20 atomic percent. Each of the $Pb_{1-x}Sn_xZ$ layers has a layer thickness in the range of from about 30 nm to 70 nm. The PbSnZ-based alloys are grown on a substrate.

Alternatively, in the method for electrically pumping the PbSnZ alloy based multiple quantum well structure to generate mid-infrared light, the multiple quantum well structure is placed between n-type and p-type electrical contact layers and the step of pumping is accomplished by providing an electrical current.

Additionally, an array including at least two PbSrZ alloy based multiple quantum well structures or at least two PbSnZ alloy based multiple quantum well structures, wherein each multiple quantum well structure has separate n-type and p-type electrical contact layers, can be maintained at temperatures above cryogenic temperatures and each multiple quantum well structure separately electrically pumped to generate mid-infrared light.

An object of this invention is to provide a method for generating mid-infrared light by maintaining an optically active, multiple quantum well structure at temperatures above cryogenic temperatures, including at room temperature, and pumping it with laser light having a wavelength shorter than the wavelength of the mid-infrared light generated. Another object of this invention is to provide a method for generating mid-infrared light by maintaining an optically active, multiple quantum well structure including n-type and p-type electrical contact layers at temperatures above cryogenic temperatures, including at room temperature, and pumping it electrically.

Other and further objects, features, and advantages of the present invention will be readily apparent to those skilled in the art upon reading the description of the preferred embodiments which follows.

DESCRIPTION OF PREFERRED EMBODIMENTS

Mid-infrared light can be generated at a selected temperature at or near room temperature without the need for additional cryogenic components by optically or electrically pumping multiple quantum well materials, fabricated with bandgaps specifically engineered to satisfy particular device design requirements, including light emission at a selected wavelength.

Figure 1:
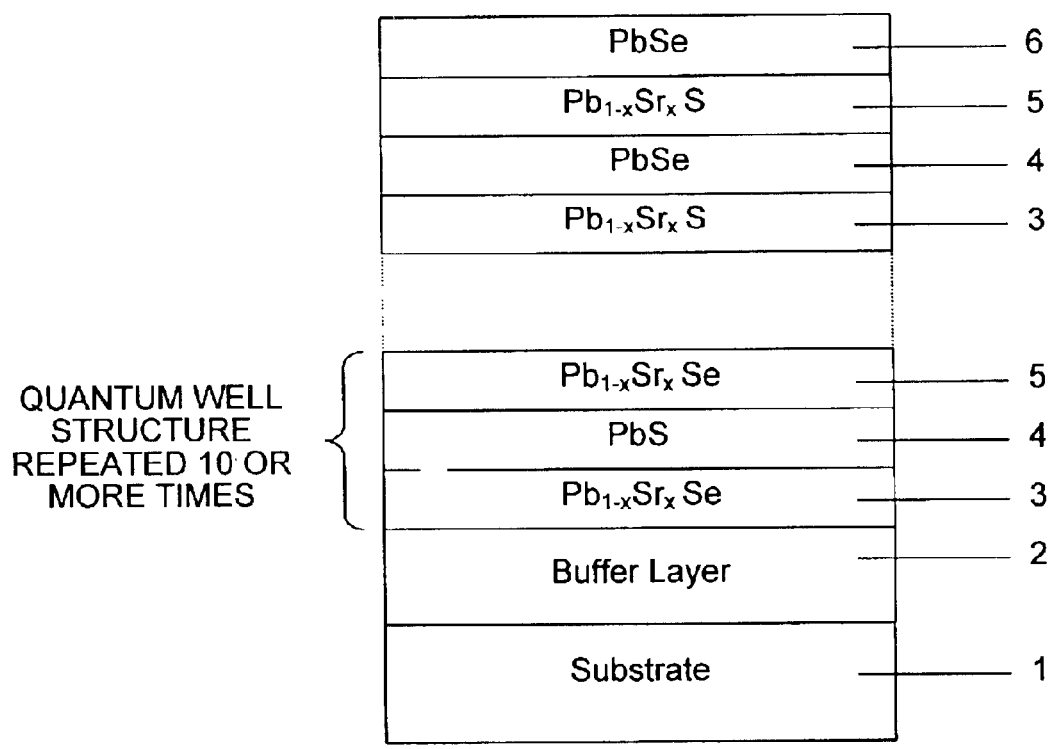
FIG. 1 is a schematic representation of a multiple quantum well structure.

FIG. 1 is a schematic representation of a preferred embodiment of a multiple quantum well device based on the PbSe/Pb$_{1-x}$Sr$_x$Se alloy system. Buffer layer 2, which is selected to have a similar lattice structure to that of the alloy system material can be a material such as a PbSrSe, PbSnSe, PbSe, CaF$_2$, or BaF$_2$ layer or combination thereof, is deposited on substrate 1 using molecular beam epitaxy (MBE) or other thin film growth technique as would be known to one skilled in the art. Substrate 1 can be a material such as BaF$_2$, Si or PbSe. A BaF$_2$ substrate offers the advantage of ready availability. Use of a Si substrate enables integration of the optically active material with other electronic circuitry on a single chip. A (100)PbSe substrate allows for ready fabrication of a conventional cleaved cavity laser. It can be cleaved along the (100) directions perpendicular to the substrate surface.

The optically active material, the quantum well, is formed by depositing a "sandwich" structure of a narrow bandgap material, PbSe layer 4 in FIG. 1, disposed between two wider bandgap material layers, Pb$_{1-x}$Sr$_x$Se layers 3 and 5, respectively in FIG. 1. This individual quantum well "sandwich" structure is repeated multiple times, from about 10 to about 70 times, to produce a multiple quantum well (MQW) material. Increasing the number, n, of individual quantum well structures in the MQW material has the effect of increasing the light output.

An optically active MQW structure based on other PbSrZ alloy systems (Sr-containing alloy systems) where Z is S, Se, or Te, or other PbSnZ alloy systems (Sn-containing alloy systems) where Z is S, Se, or Te, can also be fabricated in a manner similar to the schematic representation of FIG. 1. Use of the Sn containing alloy system provides a narrower bandgap material which has the advantage of enabling growth of an MQW material that can be used to produce longer wavelength light. Selection of a particular Group VI element such as S, Se or Te within a chosen alloy system allows additional design flexibility in producing a desired wavelength of light emission.

Figure 2:
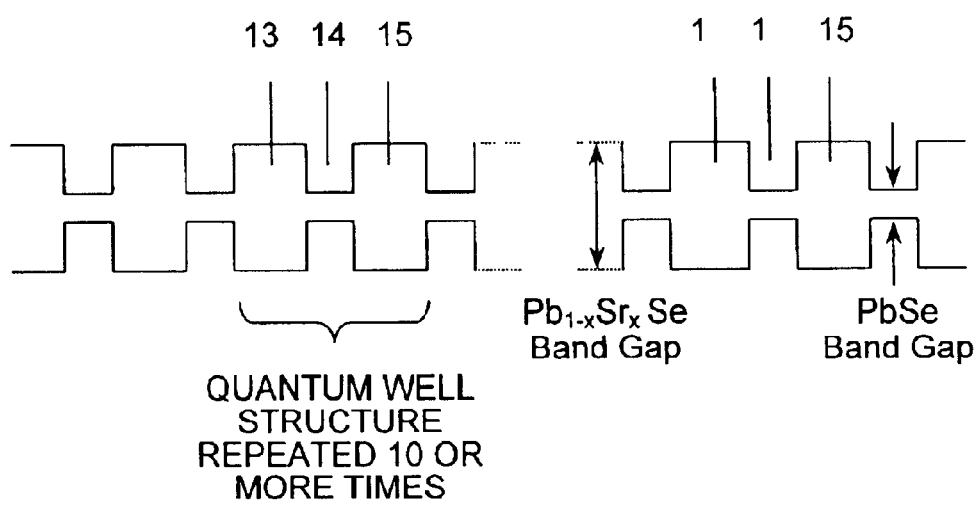
FIG. 2 is a schematic representation of the electronic band structure of a multiple quantum well material such as a $Pb_{1-x}Sr_xSe$ alloy based material.

FIG. 2 schematically illustrates the electronic band structure of an MQW material. Wide bandgap 13 corresponds to the bandgap of wide bandgap material Pb$_{1-x}$Sr$_x$Se layers 3 and 5 of FIG. 1 and narrow bandgap 14 corresponds to the narrow bandgap of PbSe layer 4 of FIG. 1. Electrons and holes are confined between the two wide bandgap layers in the narrow bandgap layer. By selecting the number, n, of individual quantum wells, the relative bandgap widths of the layers making up each quantum well and the relative thicknesses of the layers making up each quantum well, a material having a custom-designed electronic band structure and, with that, custom-designed optical activity can be fabricated.

Figure 8:
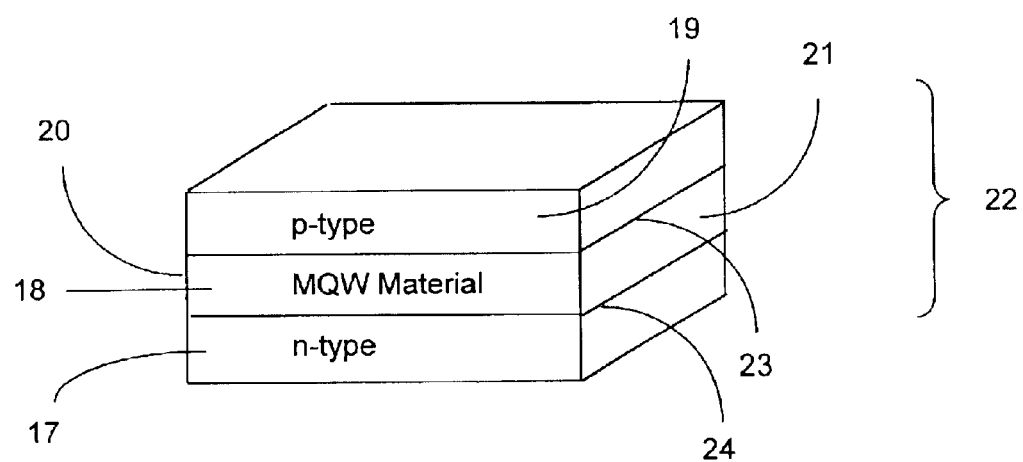
FIG. 8 is a schematic representation of a p-n junction device including an optically active multiple quantum well material.

As shown in FIG. 8, an MQW material 18, based on either a Sr-containing or Sn-containing alloy system as already described and fabricated as already described, can be further sandwiched between n-type layer 17 and p-type layer 19 to form MQW-based diode structure 22. The n-type layer can be the electron injection material and the p-type layer can be the hole injection material both having compositions well known to one skilled in the art. Typical thicknesses of the n- and p-type layers are in the range of about 200 nm to about 2000 nm.

Cleaved facets 20 and 21 as shown in FIG. 8 can be made in a plane perpendicular to surfaces 23 and 24 of MQW material 18, thereby making MQW-based diode structure 22 a conventional cleaved cavity laser. Such a laser would be electrically pumped.

Figure 9:
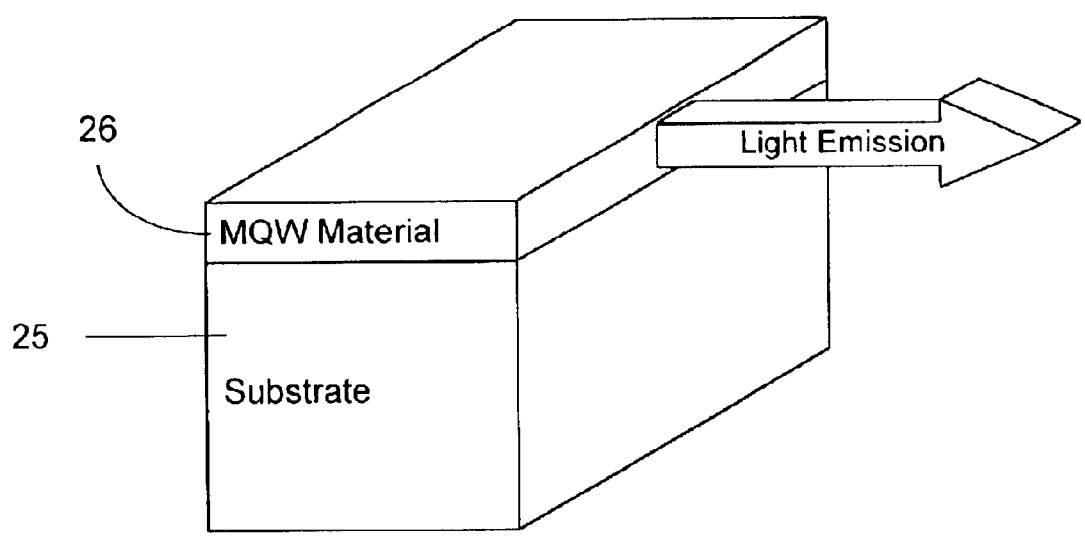
FIG. 9 is a schematic representation of an optically-pumped multiple quantum well light emitting material.

If n-type layer 17 and p-type layer 19, are absent from the already-described device, a conventional cleaved cavity laser including substrate 25 and MQW material 26 that can be optically, instead of electrically, pumped is obtained as shown in FIG. 9.

Figure 10:
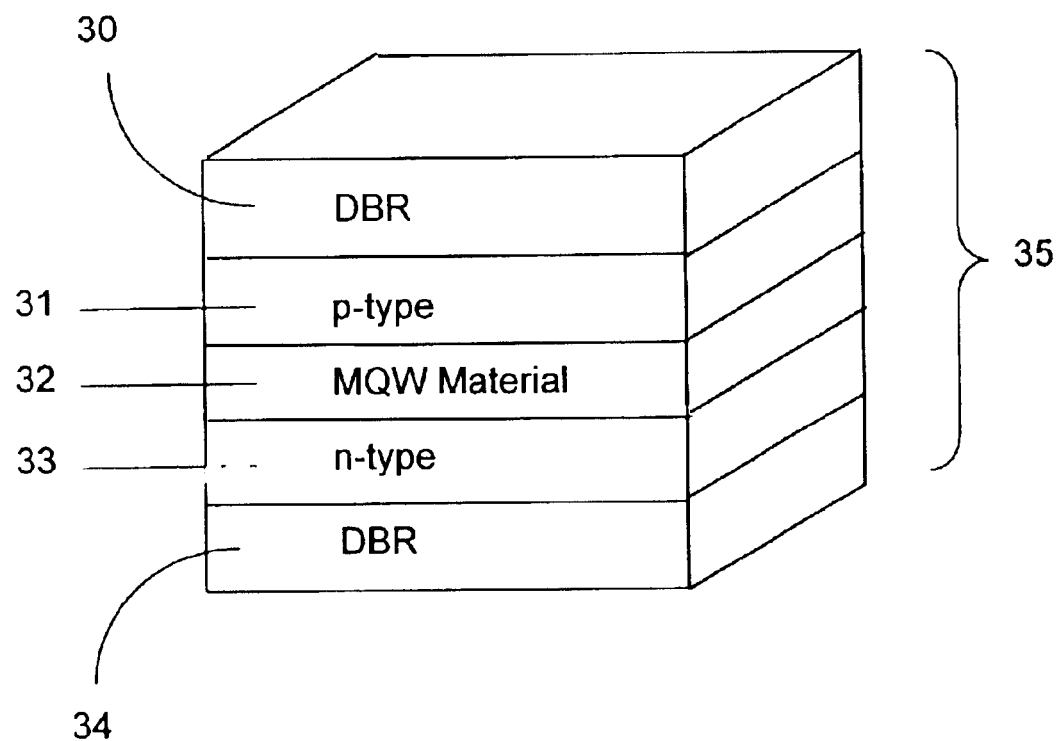
FIG. 10 is a schematic representation of an electrically-pumped vertical cavity surface emitting laser (VCSEL).
Figure 11:
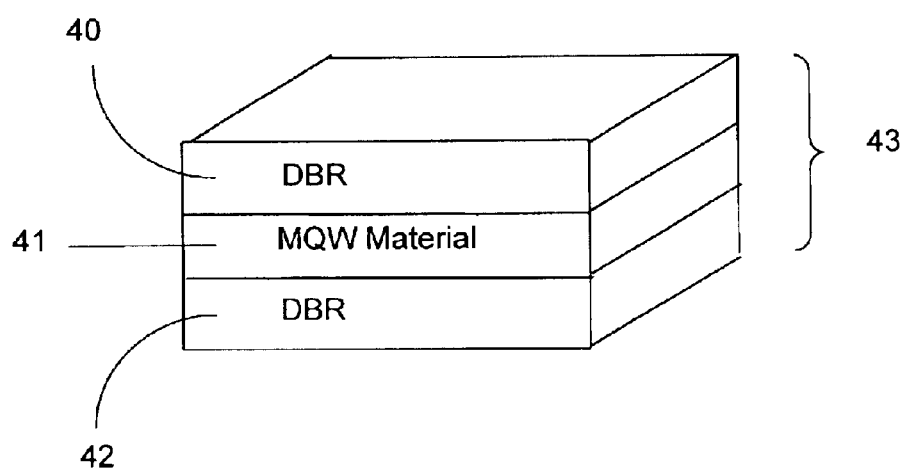
FIG. 11 is a schematic representation of an optically-pumped vertical cavity surface emitting laser (VCSEL).

Alternatively, as shown in FIG. 10, MQW material 32 can be disposed between two distributed Bragg reflectors (DBR's) 30 and 34 to form a conventional vertical cavity surface emitting laser (VCSEL) structure 35. A VCSEL structure can be fabricated by growing alternating layers of high and low refractive index materials as would be well known to one skilled in the art. When MQW material 32 intervenes between n-type layer 33 and p-type layer 31, an electrically pumped laser is obtained FIG. 11 shows, alternatively, a VCSEL structure without any n-type or p-type layers. The VCSEL structure of FIG. 11, including MQW layer 41 and two distributed Bragg reflectors 40 and 42, would be optically pumped. Typically, DBR's 30 and 34 are the same.

Figure 12:
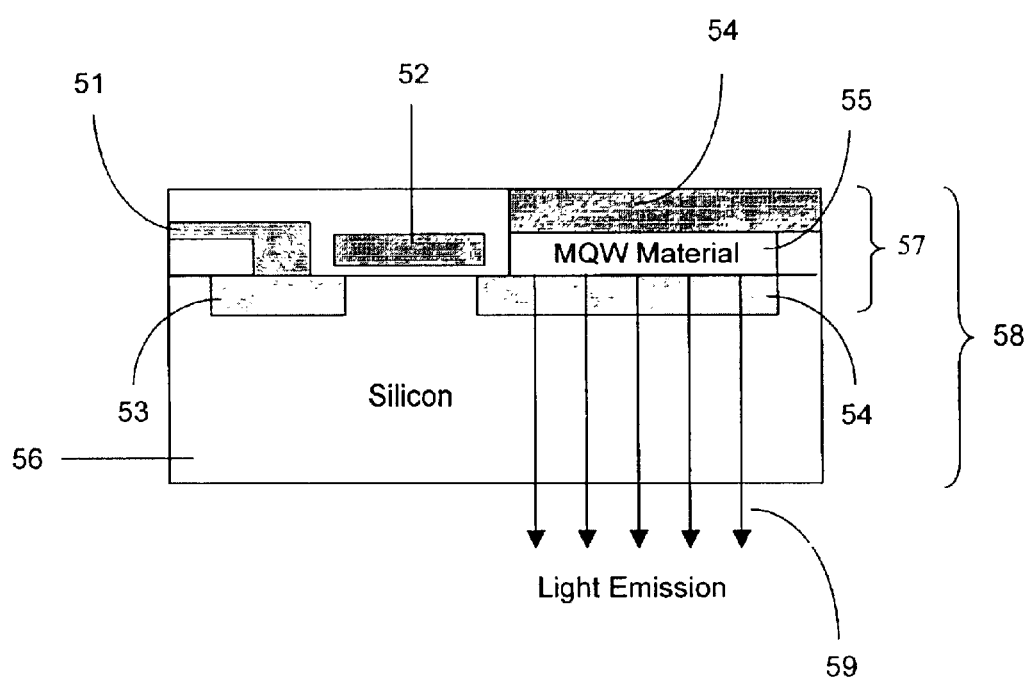
FIG. 12 is schematic representation of optically active multiple quantum well material device on silicon.

As shown in FIG. 12, the MQW material can be grown on silicon substrate 56 to produce an optically active device as part of an addressable light-emitting circuit element 58. Addressable light-emitting circuit element 58 includes electrical contact 51, gate electrode 52, source diffusion 53, drain diffusion 54, MQW material 55, and electrical contact 60. Such a silicon-based light-emitting circuit element can be readily fabricated using techniques well known to one skilled in the art. Light emission shown by arrows 59 is through silicon substrate 56.

Figure 13:
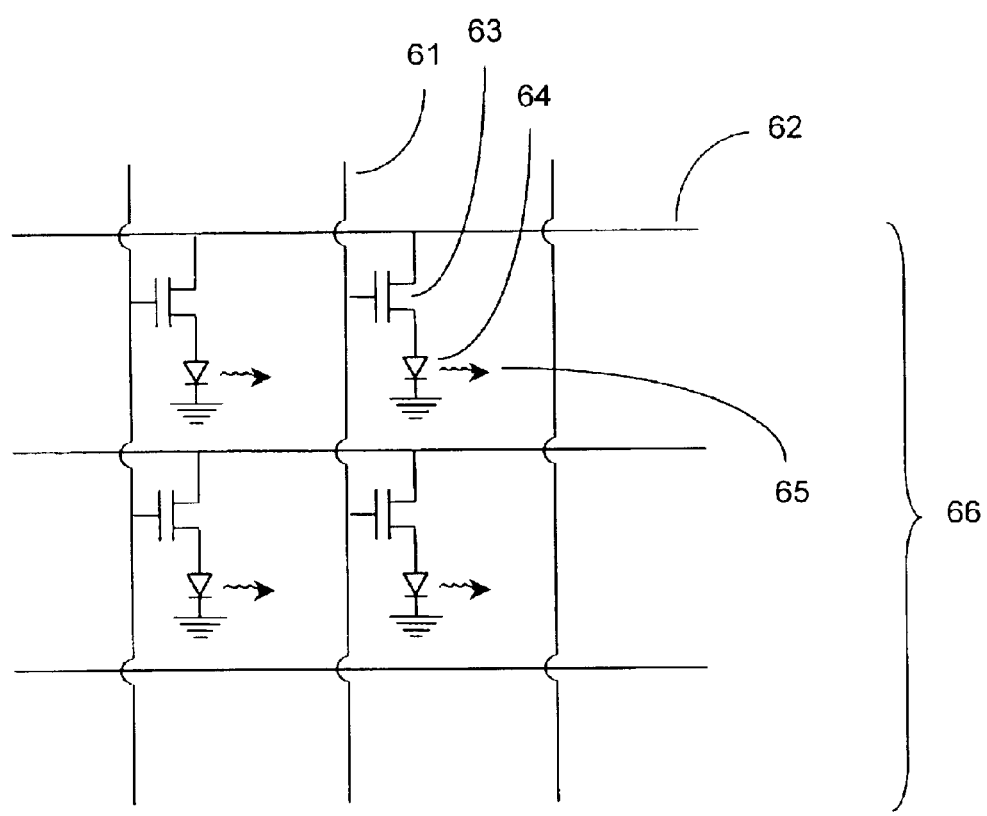
FIG. 13 is a schematic representation of an array of optically active multiple quantum well materials integrated with silicon devices.

FIG. 13 shows four addressable light-emitting circuit elements 58 combined into 2×2 array 66. Array 66 includes gate electrode address line 61, source electrode address line 62, field effect transistor 63, and MQW light emitting material 64. Arrows 65 represent emitted light.

EXAMPLE 1

The following example demonstrates a method for obtaining light emission, particularly photoluminescence in the 3–5 micron range, at room temperature using PbSe/PbSrSe multiple quantum well structures. The example also describes the growth and subsequent structural and optical property characterization of the multiple quantum well materials.

All structures were grown on $BaF_2(111)$ substrates in an Intevac GEN II MBE system. $BaF_2$ substrates were freshly cleaved from a (111)-oriented 1 cm×1 cm ingot and mounted onto a uniblock with a silicon backing plate. Before being transferred to the growth chamber, the substrate was outgassed in the preparation chamber at 200° C. for 1 hour.

After the $BaF_2$ substrate was transferred to the growth chamber, the substrate temperature was ramped up to 550° C. until a sharp $BaF_2$ (1×1) reflection high-energy electron diffraction (RHEED) pattern appeared. A 100-nm-thick $BaF_2$ buffer layer was first grown on the substrate at 500° C. The growth temperature was measured using a thermocouple. X-ray diffraction measurements showed that the growth of a $BaF_2$ buffer layer could reduce the linewidth of (222) diffraction of the subsequently grown PbSrSe layer by 30%–50%. A 3-micron-thick PbSrSe layer was then grown on top of the $BaF_2$ buffer layer at 360° C. The growth of PbSrSe was carried out by evaporating PbSe and elemental Sr sources. The Sr composition was controlled by varying the Sr to PbSe flux ratio. The actual Sr content was determined from x-ray diffraction measurements. An additional Se source was used to control the stoichiometry of PbSe and PbSrSe layers and keep the surface under Se rich conditions. A valved cracker cell was used to produce a Se flux of 10% relative to the total PbSe and Sr fluxes. The typical beam equivalent pressure of PbSe is about $1.56 \times 10^{-6}$ Torr. The PbSe and PbSrSe growth rates were both about 180 Angstroms/min.

To grow a multiple quantum well structure, 10–40 periods of PbSe/PbSrSe were grown on top of the PbSrSe buffer layer at 360° C. The thicknesses of the PbSe quantum well and PbSrSe barrier were in the range of 40–200 and 400–500 Angstroms, respectively. To prevent the final PbSrSe layer from being oxidized, a 10-nm-thick PbSe cap layer was grown on top of either a single PbSrSe layer or a PbSe/PbSrSe multiple quantum well structure. All the PbSe and PbSrSe layers were undoped.

Growth was monitored in situ using the RHEED technique. Ex situ structural characterization of the epilayers was performed using a Philips high-resolution x-ray diffraction system with a four-crystal Ge (220) monochromator. Fourier transform infrared (FTIR) transmission measurements were carried out using a BioRad spectrometer (FTS-60A) with a wave number range of 500–6000 $cm^{-1}$. Photoluminescence (PL) measurements were performed using a modular FTIR spectrometer (Oriel, MIR8000). MBE samples were illuminated with a 972 nm InGaAs laser. The injection current for the InGaAs pump laser was 500 mA producing about 250 mW of power. The unfocused laser, located about 10 mm from the sample at about a 45° angle, produced a spot size of about 2 mm×7 mm on the sample surface. An average power density of about 1.8 $W/cm^2$ is thus estimated. The PL setup can readily be constructed by one skilled in the art.

Figure 3:
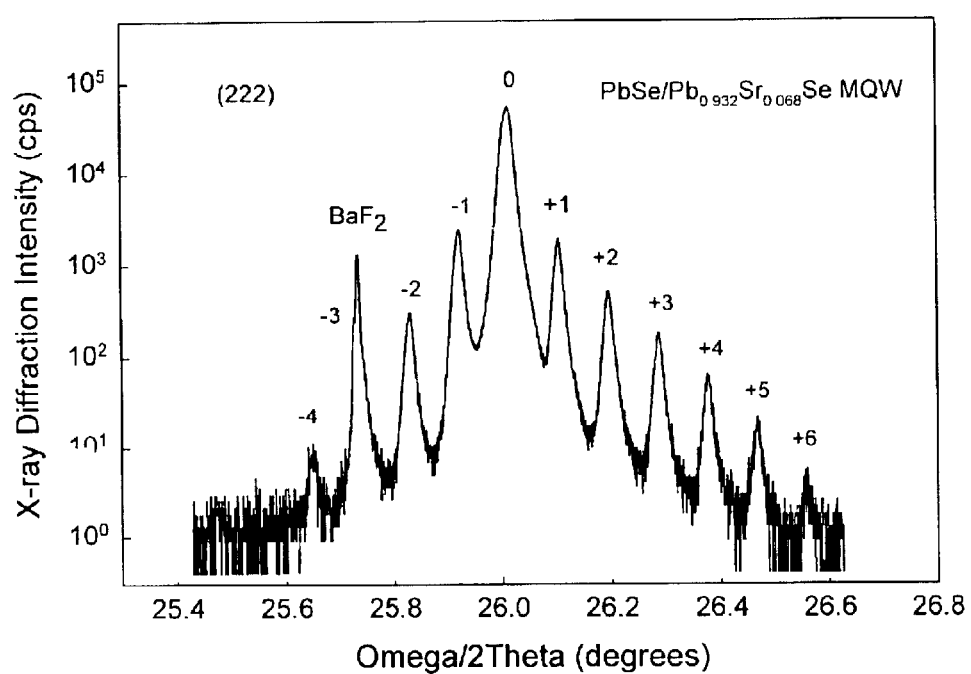
FIG. 3 is an x-ray diffraction rocking curve for a forty period PbSe(10 nm)/$Pb_{0.932}Sr_{0.068}$Se(50 nm) multiple quantum well structure grown on a $BaF_2$ substrate.

FIG. 3 shows an x-ray diffraction rocking curve for a PbSe/PbSrSe multiple quantum well (MQW) structure grown on $BaF_2$ at 360° C. Satellite reflection peaks with the order up to 7 were clearly seen from the MQW sample indicating the high quality of the sample. These data confirm the layered structure of the material and show that the interfaces between the PbSe and PbSrSe layers are smooth and compositionally abrupt.

Figure 4:
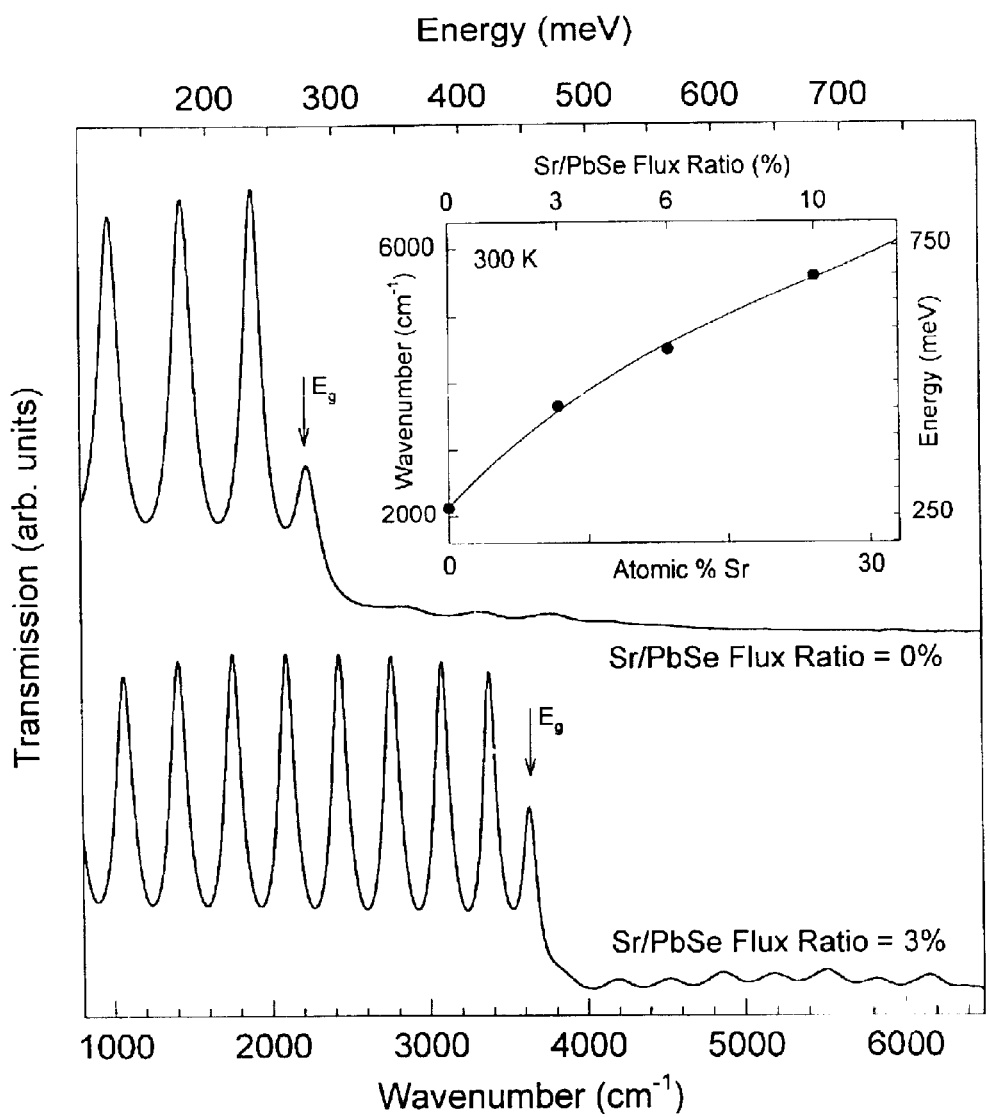
FIG. 4 is a plot of transmission intensity as a function of wavenumber for two PbSrSe alloys and a plot of bandgap as a function of Sr content.

FIG. 4 shows the results of infrared transmission measurements from which the absorption edge or the bandgap energy, $E_g$, for each of the layers making up the MQW structure is determined. These data show that bandgap energy increases as Sr content increases.

Figure 5:
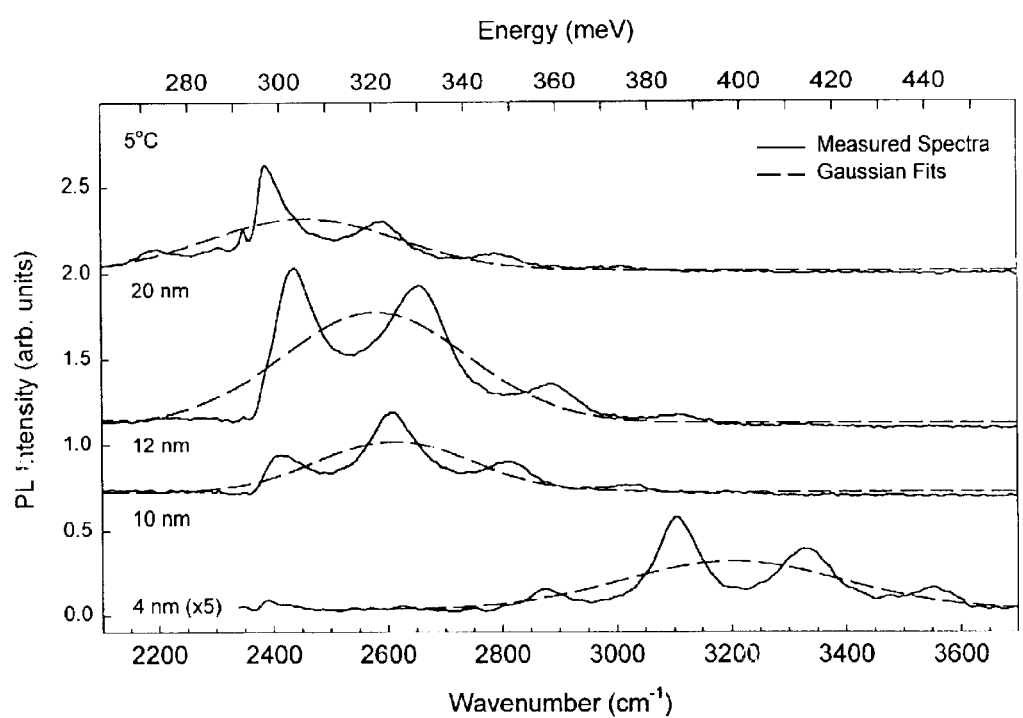
FIG. 5 is a plot of photoluminescence spectra at 5° C. from forty period PbSe/Pb$_{0.932}$Sr$_{0.068}$Se multiple quantum well structures with four different quantum well thicknesses (4, 10, 12 and 20 nm) grown by MBE on BaF$_2$.

FIG. 5 shows measured spectra along with Gaussian fits to the data for four MQW samples at 5° C. with different quantum-well thicknesses. Each measured spectrum exhibits multiple peaks separated by about 200 $cm^{-1}$. These are Fabry-Perot interference fringes due to resonance in the optical cavity formed by the layer. Using the equation of $n=(2t\Delta\upsilon)^{-1}$, where n is the index of refraction, t is the measured total film thickness including the 3-micron-thick PbSrSe buffer layer, and $\Delta\upsilon$ is the fringe spacing, the average value for the index of refraction for the layers is 4.79. This index of refraction is smaller than the 4.9 value for the index of refraction of PbSe near its band gap, which is consistent with the fact that most of the optical cavity consists of larger band gap (and thus smaller index) PbSrSe. The appearance of Fabry-Perot interference fringes in the PL spectra shows that there is significant internal reflection inside the layer and indicates that sample luminescence is dominated by stimulated emission processes.

Figure 6:
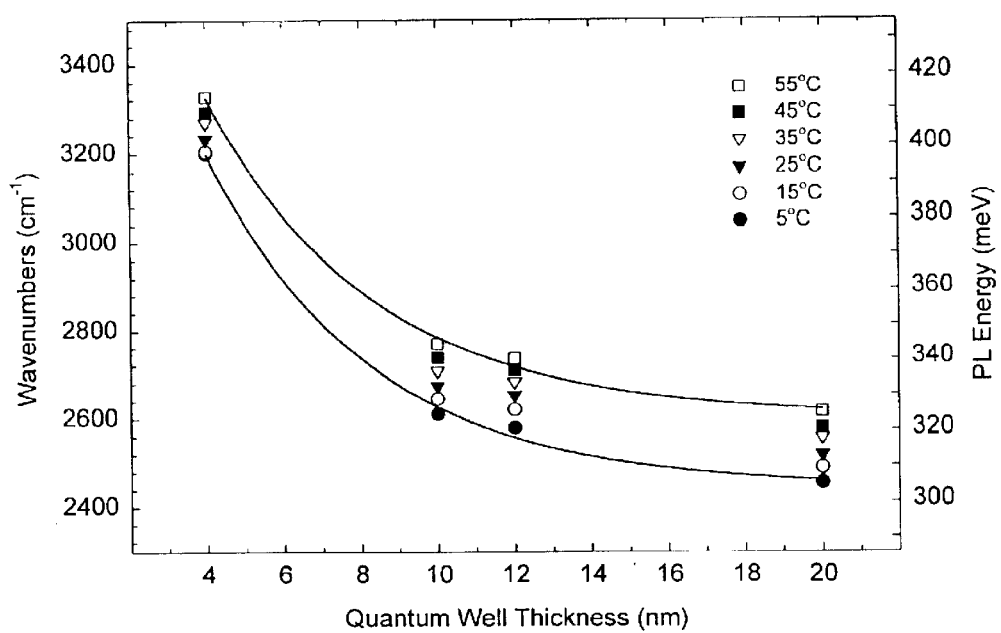
FIG. 6 is a plot of photoluminescence peak energies, obtained from fitted Gaussian functions to the spectra measured at temperatures ranging from 5° C. to 55° C., as a function of quantum well thickness.

FIG. 6 is a plot of the peak energies obtained from Gaussian fits to the measured PL spectra at temperatures ranging from 5° C. to 55° C. as shown on the graph for each sample as a function of quantum well thickness. A shift in the PL emission energy from 312 to 402 meV is observed as the quantum-well thickness is decreased from 200 to 40 Angstroms. With PL energies significantly above the 275 meV room temperature band gap value of bulk PbSe and a strong blueshift with decreasing well width it is clear that this photoluminescence is due solely to recombination of quantum confined electron-hole pairs. Full width half maxima (FWHM) values obtained from the Gaussian fits were 36.3 and 41.3 meV from two samples with 500 Angstrom barriers and 45.6 and 51.0 meV for two samples with 400 Angstrom barriers respectively. There is no correlation between FWHM and the quantum well thickness. Larger peak widths for samples with thinner barriers suggest that the confined states form a miniband and that the amplitudes of the electron and/or hole wave functions are not zero after penetrating a 400-Angstrom-thick barrier.

The foregoing PL spectra results are the only known evidence of mid-infrared light emission obtained above room temperature, at temperatures even as high as 55° C., with continuous-wave near infrared, i.e. a wavelength in the range of from about 0.8 micron to about 3.0 microns, diode laser pumping, and without any type of lock-in amplification or double modulation signal enhancing techniques. These results demonstrate the efficacy of the method of the invention for generating mid-infrared light at temperatures that include room temperature.

EXAMPLE 2

The following example describes the first experimental demonstration of a method for generating mid-infrared light emission in a temperature range including room temperature using an optically active MQW structure grown on silicon.

PbSe/Pb$_{1-x}$Sr$_x$Se MQW structures were grown on three inch diameter (111)-oriented silicon substrates in an Intevac GEN II modular MBE system. Typical structures consisted of a 20 Angstrom thick CaF$_2$ layer, a 3 micron thick Pb$_{1-x}$Sr$_x$Se buffer layer, a 20 to 40 period MQW structure with 10 nm thick wells (PbSe) and 50 nm thick barriers (Pb$_{1-x}$Sr$_x$Se) and a 10 nm thick PbSe capping layer to reduce strontium oxidation. The strontium content in the 3 micron thick buffer and 50 nm thick barrier layers was approximately 7% as determined from x-ray diffraction measurements and Vegard's law. The Sr/PbSe flux ratio during MBE growth of the Pb$_{1-x}$Sr$_x$Se layers was 3%. Detailed procedures for CaF$_2$ and IV–VI semiconductor growth on (111)-oriented silicon substrates as well as of PbSrSe/PbSe MQW's are known to one skilled in the art. A near-IR diode laser with emission at 976 nm was used to perform the PL measurements according to procedures known to one skilled in the art and as already described in Example 1. For the PL measurements the diode laser was normally incident and about 4 mm away from the sample producing an unfocussed spot size of about 2 mm in diameter. The diode laser injection current was also varied from 300 mA to 800 mA, and this corresponded to an approximately linear variation in pump power (density) from 160 mW (5.1 W/cm$^2$) to 630 mW (20 W/cm$^2$). A single stage thermoelectric cooling (TEC) module was used to stabilize the sample temperature, which was measured with a thermistor placed adjacent to the sample on a copper plate attached to the TEC. All measurements were performed in continuous wave mode and luminescence from the MQW layer was observed through the silicon substrate.

Figure 7:
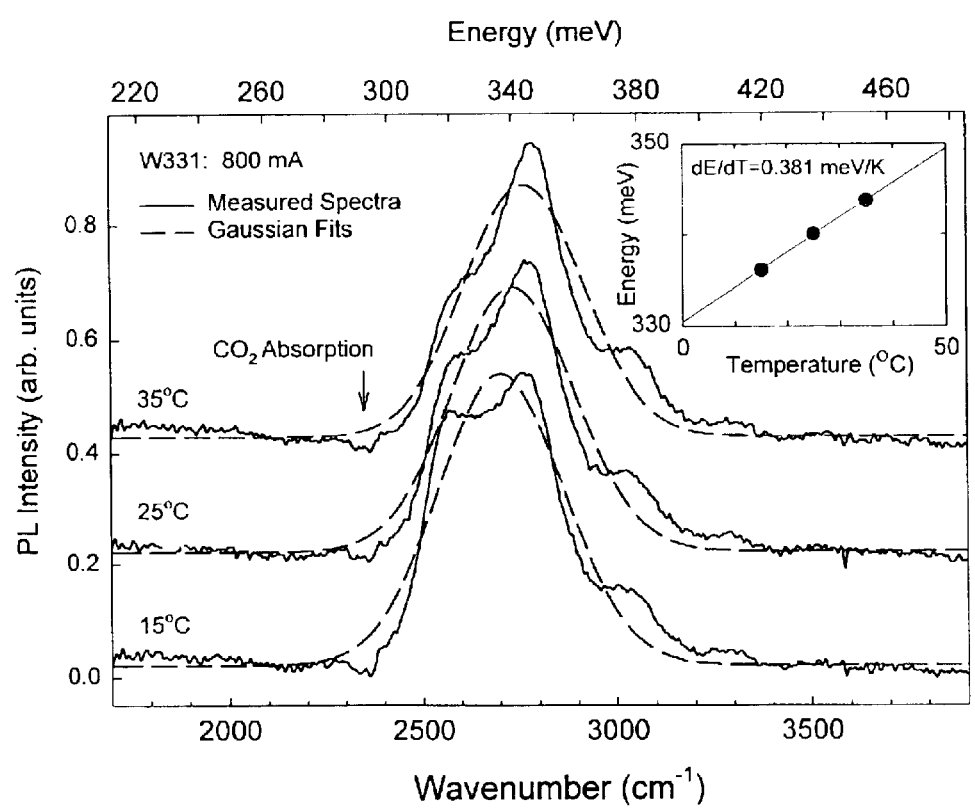
FIG. 7 is a plot of photoluminescence intensity as a function of wave number for a twenty period PbSe(10 nm)/Pb$_{0.932}$Sr$_{0.068}$Se(50 nm) multiple quantum well material (10 nm thick PbSe quantum wells) on (111) silicon for heat sink temperatures ranging from 15° C. to 35° C.

FIG. 7 shows PL spectra from a IV–VI MQW layer on silicon at temperatures of 15° C., 25° C., and 35° C. for a constant diode laser injection current of 800 mA. Multiple peaks between 300 meV and 420 meV are observed. These peaks, which are due to optical resonance inside the layer, are not as pronounced as those observed in the PL spectra for IV–VI MQW layers grown on BaF$_2$ substrates. These Fabry-Perot resonance peaks are weaker because of the much smaller refractive index contrast between the IV–VI material (n approximately 5.4) and silicon (n=3.42) as compared to BaF$_2$ (n=1.45). PL peak energies obtained from Gaussian fits, dashed lines in FIG. 7, vary linearly from 336.1 meV to 343.7 meV as shown in the inset as the temperature is increased from 15° C. to 35° C. The temperature tuning coefficient for this sample is 0.38 meV/K.

Above room temperature, continuous wave PL spectra have been obtained from several different MQW layers grown on silicon substrates, including a sample with a forty period MQW and a similar dependence of PL energy on PbSe well width is observed as with layers grown on BaF$_2$ as already described in the foregoing Example 1. Additionally, the samples are quite robust and the PL results are highly reproducible even after several temperature cycles and repeated testing with near-IR laser irradiation. No degradation in PL intensity has been observed either due to testing or storage in laboratory air. Strong luminescence has also been observed from MQW structures grown on silicon with approximately 500 nm thick BaF$_2$ layers grown between the CaF$_2$ layer and the Pb$_{1-x}$Sr$_x$Se buffer layer. Growth of such structures allows removal of the silicon growth substrate and transfer of the IV–VI layer to a more thermally conductive substrate such as copper by dissolving the BaF$_2$ layer with water. The observed mid-infrared emission under a variety of test conditions demonstrates the efficacy of this method for generating mid-infrared light at temperatures including room temperature.

What is claimed is:

1. A method for generating mid-infrared light comprising: providing a (111)-oriented multiple quantum well structure including a plurality, n, of quantum wells, where n is in the range of from 10 to about 70 and wherein each of said quantum wells further includes a Pb$_{1-y}$Sr$_y$Z layer where Z is selected from the group consisting of S, Se, and Te, y is in the range of from about 0 atomic percent to about 15 atomic percent characterized by a layer thickness in the range of from about 2 nm to about 40 nm disposed between two Pb$_{1-x}$Sr$_x$Z layers wherein x>y and x is in the range of from about 0 atomic percent to about 20 atomic percent and wherein each of said Pb$_{1-x}$Sr$_x$Z layers is further characterized by a layer thickness in the range of from about 30 nm to 70 nm and a (111)-oriented silicon substrate; maintaining said (111)-oriented multiple quantum well structure at a temperature in the range of from about 5° C. to about 55° C.; and pumping said (111)-oriented multiple quantum well structure with a pump beam of laser light characterized by a pump laser light wavelength shorter than a mid-infrared light wavelength so that mid-infrared light is emitted from said (111)-oriented multiple quantum well structure.

2. The method of claim 1 wherein said pump laser light wavelength is a wavelength in the range of from about 0.8 micron to about 3.0 micron.

3. The method of claim 1 wherein said step of pumping said (111)-oriented multiple quantum well structure further includes providing a diode laser to generate said pump beam of laser light.

4. The method of claim 1 wherein said mid-infrared light is emitted through said substrate.

5. The method of claim 1 wherein said step of pumping is performed with a continuous wave light source.

6. A method for generating mid-infrared light comprising; providing a (111)-oriented multiple quantum well structure including a plurality, n, of quantum wells, where n is in the range of from about 10 to about 70 and wherein each of said quantum wells further includes a Pb$_{1-y}$Sr$_y$Z layer where Z is selected from the group consisting of S, Se, and Te, y is in the range of from about 0 atomic percent to about 15 atomic percent characterized by a layer thickness in the range of from about 2 nm to about 40 nm disposed between two Pb$_{1-x}$Sr$_x$Z layers wherein x>y and x is in the range of from about 0 atomic percent to about 20 atomic percent and wherein each of said Pb$_{1-x}$Sr$_x$Z layers is further characterized by a layer thickness in the range of from about 30 nm to 70 nm and a (111)-oriented silicon substrate; placing said (111)-oriented multiple quantum well structure between an n-type electrical contact layer and a p-type electrical contact layer; maintaining said (111)-oriented multiple quantum well structure at a temperature in the range of from about 50° C. to about 55° C.; and pumping said (111)-oriented multiple quantum well structure with a pump electrical current so that mid-infrared light is emitted from said (111)-oriented multiple quantum well structure.

7. The method of claim 6 wherein said mid-infrared light is emitted through said substrate.

8. The method of claim 6 including providing a second (111)-oriented multiple quantum well structure including a plurality, n, of quantum wells, where n is in the range of from about 10 to about 70 and wherein each of said quantum wells further includes a Pb$_{1-y}$Sr$_y$Z layer where Z is selected from the group consisting of S, Se, and Te, y is in the range of from about 0 atomic percent to about 15 atomic percent characterized by a layer thickness in the range of from about 2 nm to about 40 nm disposed between two $Pb_{1-x}Sr_xZ$ layers wherein x>y and x is in the range of from about 0 atomic percent to about 20 atomic percent and wherein each of said $Pb_{1-x}Sr_xZ$ layers is further characterized by a layer thickness in the range of from about 30 nm to 70 nm and a substrate; placing said second (111)-oriented multiple quantum well structure between a second n-type electrical contact layer and a second p-type electrical contact layer; maintaining said second (111)-oriented multiple quantum well structure at a temperature in the range of from about 50° C. to about 55° C.; and pumping said second (111)-oriented multiple quantum well structure with a second pump electrical current so that mid-infrared light is emitted from said second (111)-oriented multiple quantum well structure.

* * * * *